(12) United States Patent
Hayama et al.

(10) Patent No.: US 6,429,114 B1
(45) Date of Patent: Aug. 6, 2002

(54) METHOD FOR FABRICATING A MULTILAYER CERAMIC SUBSTRATE

(75) Inventors: Masaaki Hayama, Nara; Noboru Mouri; Hayami Matsunaga, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/173,288

(22) Filed: Oct. 14, 1998

(30) Foreign Application Priority Data

Oct. 14, 1997 (JP) .............................................. 9-280111

(51) Int. Cl.[7] .............................................. H01L 21/44
(52) U.S. Cl. .................. 438/616; 438/108; 438/611; 438/621; 438/622; 438/638; 438/670
(58) Field of Search ................................ 438/106, 108, 438/620, 622, 623, 637, 638, 611, 616, 670, 342, 343, 363, 455, 485, 489; 257/700, 701, 702, 703, 758

(56) References Cited

U.S. PATENT DOCUMENTS

| | | | | |
|---|---|---|---|---|
| 5,106,461 A | * | 4/1992 | Volfson et al. .............. | 205/125 |
| 5,488,542 A | * | 1/1996 | Ito ............................... | 361/793 |
| 5,524,784 A | * | 6/1996 | Shiba et al. .................. | 216/27 |
| 5,609,704 A | * | 3/1997 | Hayama et al. ............... | 156/89 |
| 5,627,406 A | * | 5/1997 | Pace ........................... | 257/700 |
| 5,643,831 A | * | 7/1997 | Ochiai ......................... | 438/616 |
| 5,866,441 A | * | 2/1999 | Pace ........................... | 438/108 |
| 5,892,273 A | * | 4/1999 | Iwaski et al. ................ | 257/690 |
| 5,926,694 A | * | 7/1999 | Chigawa et al. ............. | 438/106 |
| 5,962,925 A | * | 10/1999 | Eifuku ........................ | 257/778 |
| 6,027,995 A | * | 2/2000 | Chiang et al. ............... | 438/623 |
| 6,051,448 A | * | 4/2000 | Hayama et al. ............. | 438/108 |
| 6,100,177 A | * | 8/2000 | Noguchi ...................... | 438/620 |
| 6,123,863 A | * | 9/2000 | Shimomura et al. ........... | 216/27 |
| 6,132,543 A | * | 10/2000 | Mohri et al. .............. | 156/89.12 |
| 6,172,422 B1 | * | 1/2001 | Chigawa et al. ............. | 257/778 |

FOREIGN PATENT DOCUMENTS

| | | | |
|---|---|---|---|
| JP | 4-221674 | * | 8/1992 |
| JP | 4-240792 | * | 8/1992 |
| JP | 6-267963 | * | 9/1994 |
| JP | 10-242324 | * | 9/1998 |

* cited by examiner

*Primary Examiner*—Olik Chaudhuri
*Assistant Examiner*—Alonzo Chambliss
(74) *Attorney, Agent, or Firm*—Ratner & Prestia

(57) ABSTRACT

A method of fabricating a multi-layer ceramic substrate for forming a first conductive pattern on a ceramic substrate. An intaglio plate is manufactured which has first and second grooves. The grooves are filled with an electroconductive paste. Conductivity of paths in the grooves is increased by deaerating and drying the paste. The intaglio plate is glued to and then separated from a ceramic substrate so that the pattern of the pattern of the electroconductive paste is transferred to the substrate. An insulation layer and a further conductive pattern are then applied.

15 Claims, 13 Drawing Sheets

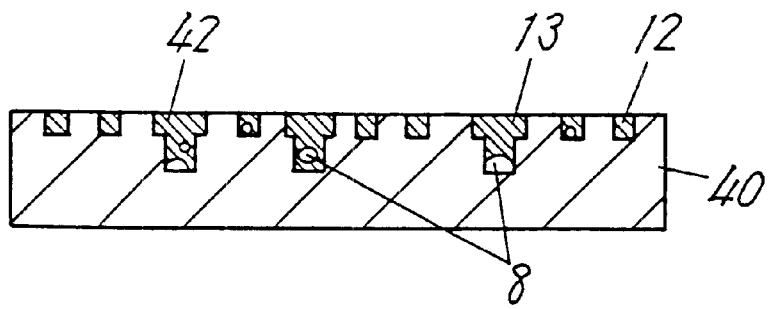
FIG. 3(a)
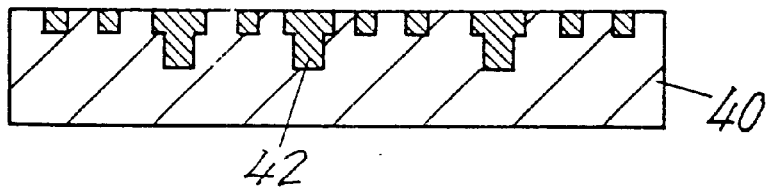
FIG. 3(b)
FIG. 4
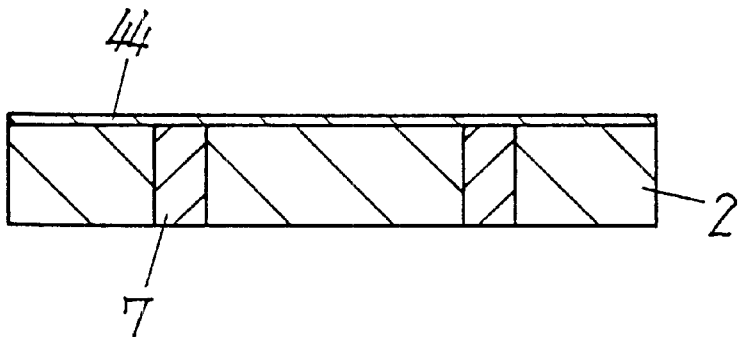

METHOD FOR FABRICATING A MULTILAYER CERAMIC SUBSTRATE

FIELD OF THE INVENTION

The present invention relates to a multilayer ceramic substrate for use in various electronic appliances, and the manufacturing method therefor.

BACKGROUND OF THE INVENTION

In order to meet the recent market preference for the smaller electronic appliances, dimensions of electronic components to be built in such appliances have been shrinking remarkably. The same goes with printed circuit boards and multilayer ceramic substrates constituting an electronic circuit. Helped by new technologies of forming conductive elements or via holes of a circuit in smaller dimensions, or by new technologies of stacking these in a multilayered configuration the wiring density in a circuit has been and will still be increased.

A conventional method for fabricating a multilayer ceramic substrate is described in the following with reference to FIG. 19(a) through FIG. 19(g). In the first place, a green sheet 51 of approximately 0.2 mm thick made mainly of alumina is provided, a via hole 52 is perforated therein at a certain specific place by punching or by means of $CO_2$ laser, the via hole 52 is then filled with an electroconductive paste (a tungsten paste, for example) by a screen printing process or other such technology and dried to complete a via 53. Then, a certain desired circuit pattern comprised of a conductive pattern 54 is formed on the green sheet 51 by screen-printing an electroconductive paste. A circuit substrate 55, which being a first layer, is thus provided.

In the same way, a second-layer circuit substrate 56, a third-layer circuit substrate 57, and, if needed, a fourth-layer circuit substrate 58 are provided; by pressing these circuit substrates together after aligning each other to a specified relative positioning a stacked circuit substrate 59 is obtained. And then it is burned at a high temperature 900–1600° C. to make a multilayer ceramic substrate 60. According to the above method, the circuit density may be increased by increasing the number of layers of the circuit substrate.

However, a conventional method for manufacturing a multilayer ceramic substrate has drawbacks in the following points.

(1) As a conductive pattern 54 is formed by means of screen printing, it is quite difficult to provide a conductive pattern in the dimensions finer than the line width (W)/line space (S)=75 $\mu$m/75 $\mu$m.

(2) In forming a conductive pattern 54 by screen printing, the film thickness of which goes thinner when the pattern is made finer. For example, when W=75 $\mu$m the greatest film thickness available is approximately 5 $\mu$m. This brings about a high electrical resistance of a wiring.

(3) In case that tungsten, among others, is used for the wiring, the disadvantages become increasingly significant when a wiring pattern is made finer, because the resistance of the wiring of tungsten is higher than silver (Ag) or copper (Cu) by approximately 3 to 5 times. Therefore, in many cases such a device may be unable to function as an electrical component.

(4) As both the substrate and the wiring material are burned simultaneously in a temperature as high as 900–1600° C., the shrinkage of material after burning reaches 15–20%; this leads to a substantial dimensional dispersion among the substrates. This results in a substantial dispersion in the dimensions of the wiring portion, which in turn results in an inaccuracy of connection with the very fine bumps of an LSI. This is a cause of deteriorated yield rate after mounting.

(5) Furthermore, when forming a conductive pattern 54 by screen printing, it requires the line width to be greater than 75 $\mu$m (normally it is more than 120 $\mu$m, taking the yield rate at printing and the wiring resistance into consideration). This necessitates the wirings to be formed in multiple layers if many wiring lines are to be formed within a limited space. The formation of lines in a higher number of multiple layers, and the control of dimensional accuracy within a high precision level inevitably lead to higher substrate cost.

SUMMARY OF THE INVENTION

To address the above problems, the present invention offers a multilayer ceramic substrate that provides a high wiring desity at a low wiring resistance, as well as the fabricating method therefor.

A method for fabricating a multilayer ceramic substrate in accordance with the present invention comprises the steps of manufacturing an intaglio plate of flexible resin on which a first groove corresponding to a first conductive pattern is formed and a second groove deeper than the first groove is formed at a place corresponding to a via hole of the first conductive pattern; filling the first and second grooves with an electroconductive paste, and deaerating and drying it; repeating the cycle of refilling additional electroconductive paste to replenish a volume corresponding to a decrement caused by the drying, and deaerating and drying it for a certain specific times; gluing the intaglio plate onto a ceramic substrate by applying heat and pressure; separating the intaglio plate from the ceramic substrate to transfer a pattern of the electroconductive paste onto the ceramic substrate, and burning it so as to form a first conductive pattern; forming a first insulation layer on the first conductive pattern; and forming a second conductive pattern on the first insulation layer.

Following advantage may be obtained in accordance with a preferred embodiment of the present invention:

(1) The line width of a conductive pattern may be reduced down to 10 $\mu$m. Regarding a multilayer ceramic substrate, a conductive pattern whose film thickness is as thick as 30 $\mu$m may be realized at a line width 30 $\mu$m, for example. Thus, the wiring resistance is low and the wiring density is high.

(2) A fine via pattern may be formed simultaneously when a conductive pattern is formed. Therefore, a wiring pattern thus formed may be fine and precise with a high dimensional accuracy.

(3) When an insulating layer is polished or ground, the surface is flattened. Therefore, the interlayer connection may not be deteriorated even when multiple number of layers are stacked. Further, the flattened surface of a multilayer ceramic substrate assures good connection with an LSI chip mounted with the face down.

(4) When a conductive pattern is formed on a burned ceramic substrate, the locational accuracy of land pattern provided for the connection with an LSI may be controlled within a dispersion of several micro meters, because the already burned ceramic substrate is used. As a result, an almost 100% mounting yield may be realized even when mounting a fine LSI whose pad to pad pitch is smaller than 100 $\mu$m on the surface of a fine and precise wiring pattern with the face down.

BRIEF DESCRIPTION OF THE DRAWINGS

FIG. 3(a) illustrates a state of the electroconductive paste provided in the intaglio plate, before deaeration; FIG. 3(b) is that after deaeration.

FIG. 4 is a cross sectional view in which a part of the multilayer ceramic substrate is shown after an adhesive layer is formed thereon.

DESCRIPTION OF THE PREFERRED EMBODIMENTS

Embodiment 1

A method of fabricating a ceramic substrate in accordance with an exemplary embodiment 1 of the present invention is described in the following with reference to the drawings FIG. 1 through FIG. 9.

Figure 1:
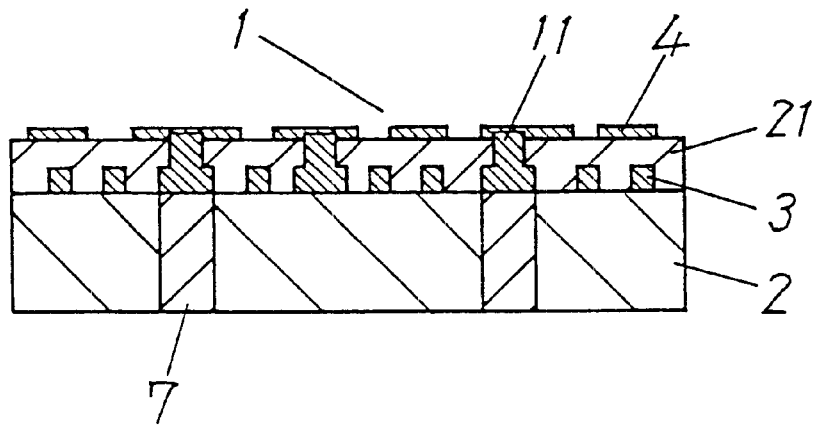
FIG. 1 is a cross sectional view in which a part of a multilayer ceramic substrate in accordance with a first embodiment of the present invention is shown.

A multilayer ceramic substrate 1 of the present embodiment is fabricated, as shown in FIG. 1, by first forming a first conductive pattern 3 on the surface of a ceramic substrate 2 with the dimensions, width of pattern line 20 $\mu$m, space between the lines 40 $\mu$m, film thickness of the pattern line 20 $\mu$m after burning, as well as a via 11 of 100 $\mu$m diameter simultaneously on the first conductive pattern; and then a first insulating layer 21 on the first conductive pattern 3. Further, on top of the first insulating layer 21 a second conductive pattern 4 is formed. The second conductive pattern 4 is electrically connected to the via 11.

Figure 2:
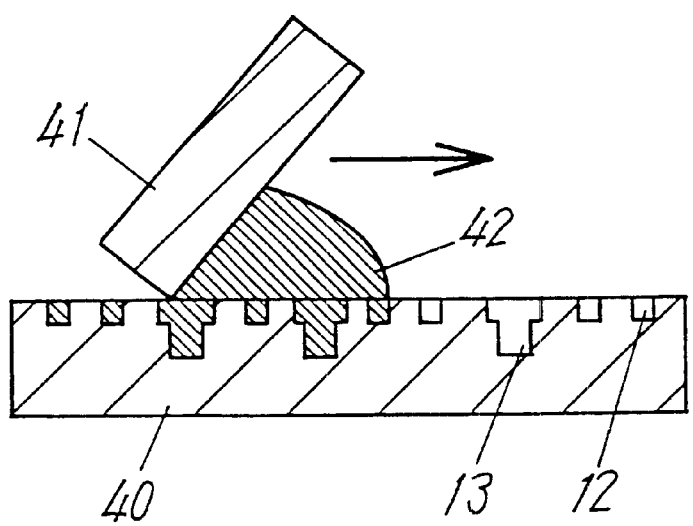
FIG. 2 illustrates how an intaglio plate is filled with an electroconductive paste in making the multilayer ceramic substrate.

Now the manufacturing method is described in the order of process sequence. A first conductive pattern 3 is formed through an intaglio printing process. An intaglio plate 40 shown in FIG. 2 is made of a polyimide film, which being a flexible resin, of 125 $\mu$m thick. On the film, a groove pattern corresponding to a certain specific wiring pattern has been provided by making use of an ultraviolet laser beam, wave length 248 nm, irradiated from an excimer laser apparatus. The portion irradiated with the laser beam is decomposed through a photochemical reaction to create a first groove 12 which corresponds to a line of first conductive pattern 3. In the present embodiment, the groove is 25 $\mu$m wide, 30 $\mu$m deep.

Then a deeper groove, or a second groove 13 corresponding to a via 11 of first conductive pattern 3, is provided through the same procedure using the above excimer laser apparatus. In the present embodiment, the second groove 13 has a diameter 120 $\mu$m at the deepest portion, and is 90 $\mu$m deep.

The use of excimer laser enables to provide a first groove 12 of even 10 $\mu$m or less wide; further, depth of the first and the second grooves 12, 13 may be controlled to any desired value. The groove may have a depth greater than the width, or the aspect ratio may be made large; which being an advantage the intaglio plate 40 has.

In a case where the excimer laser is employed for processing, any material may be used for the flexible resin in so far as it makes a photochemical reaction. So, besides the polyimide film, polyethylene terephthalate (PET), polyether-imide (PEI) or other such materials may also be used. With an intaglio plate 40 using polyimide film, separation of the electroconductive paste 42 from the grooves 12, 13, in which it is filled to be transfer-printed, is not satisfactory. Which means that during transfer-printing process the electroconductive paste 42 tends to remain in the inside of grooves 12, 13. In order to prevent such a trouble, a separation layer (not shown) is provided on the surface of intaglio plate 40, in particular, on the surface of grooves 12, 13. A single molecular film of fluorocarbon group is used for the separation layer.

An Ag—Pd paste, or an electroconductive paste 42, is applied on the surface of intaglio plate 40 over which a separation layer has been provided. Then, the surface of intaglio plate 40 is squeezed with a squeegee 41 in order to remove redundant Ag—Pd paste staying on the surface and to sufficiently fill the grooves 12, 13 with the Ag—Pd paste.

When filling the intaglio plate with the electroconductive paste 42, an air bubble 8 sometimes remains as illustrated in FIG. 3(a), this becomes significant when the width of grooves 12, 13 is narrow or a groove is deep like the second groove 13. In order to prevent the remaining of the air bubble, the intaglio plate 40 filled with electroconductive paste 42 is put into a vacuum chamber, in the present exemplary embodiment, for deaeration. And then, the surface of intaglio plate 40 is squeezed once again with the squeegee 41 for assuring a completely stuffed state without containing air bubble 8, as shown in FIG. 3(b), as well as for removing redundant paste on the surface. The deaeration may be performed by putting an intaglio plate 40 filled with electroconductive paste 42 in an revolving device to have an air bubble 8 removed by a centrifugal force. If the inside of revolving device is kept in vacuum, the air bubble 8 may be removed much easier. A most suitable method may be chosen for the deaeration taking the shape of grooves 12, 13 of intaglio plate 40 into consideration.

The filled-in Ag—Pd paste is dried in a drier together with the intaglio plate 40 in order to have an organic solvent contained in the Ag—Pd paste evaporated. The volume of Ag—Pd paste stuffed in the grooves 12, 13 decreases by an amount corresponding to that evaporated. In order to compensate the decreased volume, a process cycle of filling, deaerating and drying is repeated on the Ag—Pd paste. By repeating the process cycle, thicknesses of the stuffed Ag—Pd paste after drying have been made almost identical to the depths of grooves 12, 13. In the present exemplary embodiment, the process cycle of filling, deaerating and drying has been repeated three times.

In the ceramic substrate 2, a through hole 7 is filled with an electroconductive paste, as shown in FIG. 4, by means of screen printing, and dried. By repeating the process cycle of filling and drying, and by a burning process, the through hole 7 is completely filled with an electroconductive substance (Ag—Pd, in the present exemplary case). The ceramic substrate 2 used here is the one which has already been burned.

Figure 5:
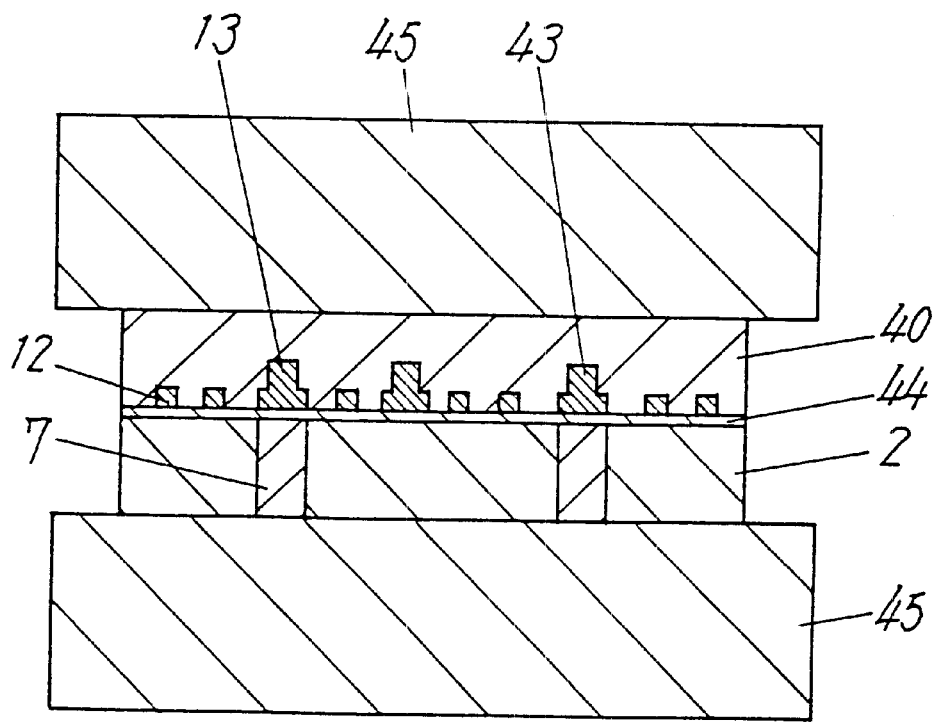
FIG. 5 illustrates how an intaglio plate and a ceramic substrate are attached stacked in making the multilayer ceramic substrate.

An adhesive layer 44 of a thermoplastic resin is formed on the ceramic substrate 2 to facilitate the transfer of conductive pattern onto the ceramic substrate 2. Then, as illustrated in FIG. 5, the intaglio plate 40 is attached on the ceramic substrate 2 with the former's surface having the grooves 12, 13 filled with dried electroconductive paste 43 facing to the adhesive layer 44; these are heated and pressed each other to be glued together. As will be described later more in detail, if the adhesive layer 44 is too thick it creates a difficulty in forming a conductive pattern because of combustion and shrinkage of the adhesive layer 44 itself. According to the results of studies conducted by the inventors, it has been confirmed that the thickness of adhesive layer 44 is preferably 20 μm or less. Preferred temperature for the gluing is 130° C. The temperature corresponds to a temperature higher than the glass transition point by approximately 30° C., and it has been confirmed that the transfer printing is best performed at the temperature.

An adhesive layer 44 of thermoplastic resin is formed by applying a solution of butylcarbitol acetate (BCA) containing polyvinyl butyral resin (PVB) on the surface of ceramic substrate 2 through a dipping method, and drying it. As the result of above processing, a PVB layer of 5 μm thick is formed as the adhesive layer 44 covering the entire surface of ceramic substrate 2. Besides the dipping method, such PVB layer may be coated through other methods; for example, spinner method, roll coater method, screen printing method. Although a thermoplastic resin has been used as a preferred material for the adhesive layer 44 in the present exemplary embodiment, a thermosetting resin may also be a preferred material.

In normal cases, a substrate 2 has an undulation of approximately 30 μm, at least, in the surface. If an inflexible material is used for the intaglio plate, for example a glass intaglio plate, the high rigidity prevents it from sufficiently complying with the surface undulation when attached to a ceramic substrate. When a resin rich in flexibility is used for the intaglio plate 40 as in the present embodiment, it complies well with the undulating contour of a substrate. Thus a fabricating method of excellent transferability is presented.

Figure 6:
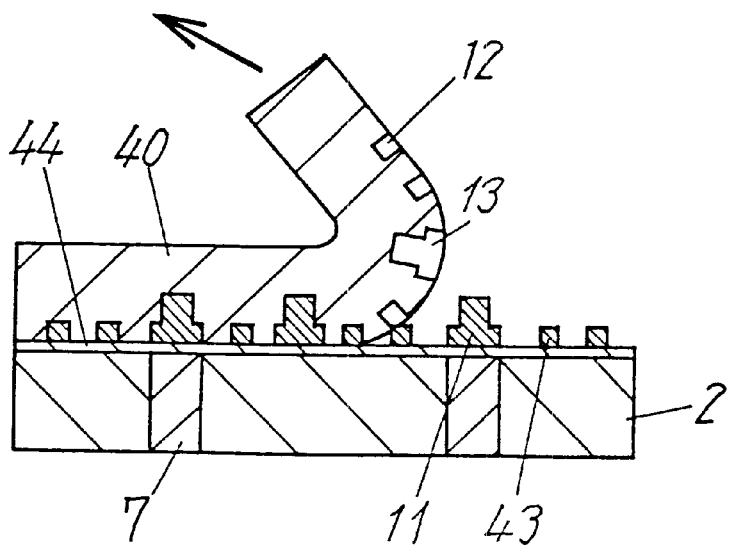
FIG. 6 illustrates a transfer printing process employed in making the multilayer ceramic substrate.

Now in the following, a process of transfer printing is described. The temperature of intaglio plate 40 and ceramic substrate 2 glued together is lowered to room temperature, and the intaglio plate 40 is peeled off the ceramic substrate 2 to have the dried electroconductive paste 43, which being a first conductive pattern formed after a certain specific wiring pattern, transferred. As the intaglio plate 40 is flexible enough, it can be bent to an angle of 90° or more, as shown in FIG. 6. As a result, the exfoliation of intaglio plate 40 from ceramic substrate 2 takes place on a linear order, which means that a force needed for separation is small and the intaglio plate 40 may be peeled off easily.

Then, the ceramic substrate 2 having the above-described dried electroconductive paste 43 transfer-printed thereon is burned in a temperature profile with the peak temperature 850° C. As a conductive pattern is formed on the ceramic substrate 2 with an adhesive layer 44 in between, the adhesive layer 44 might generate combustion gas wildly during the burning process depending on conditions set for the burning. The combustion gas may cause a peeling-off or deformation on the conductive pattern which could lead to rejection of conductive pattern. In order to avoid the occurrence of such inconvenience, it is preferred to set the temperature slope during a period of ramp up from 200–500° C., which period corresponds to the start and the end of combustion of the adhesive layer 44, to be not faster than 200° C./Hr.

Figure 7:
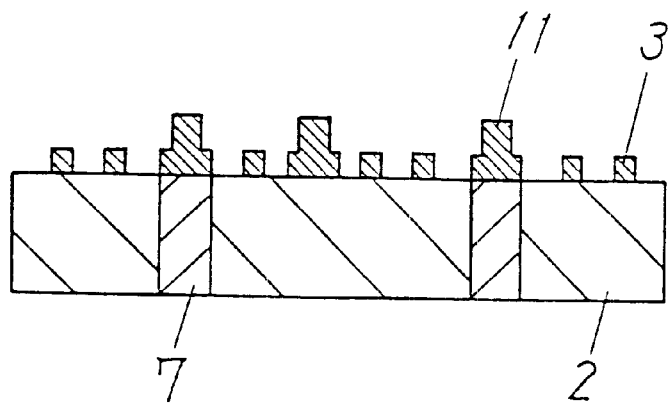
FIG. 7 is a cross sectional view in which a part of a conductive pattern in the multilayer ceramic substrate after burning is shown.

After a study conducted on the relationship between the temperature conditions and the film thickness of adhesive layer, it has been confirmed that under the above described temperature conditions neither deformation nor peeling-off occurs during burning with a conductive pattern so long as an adhesive layer 44 is kept to be not thicker than 20 μm. Through the processes described above, a first conductive pattern 3 is formed, and a substrate as shown in FIG. 7 has been obtained; with the smallest line width 20 μm, the smallest space between the lines 40 μm, the film thickness of conductive pattern after burning 20 μm, the via diameter 100 μm, the via height 60 μm. The reduction in the dimensions of line width and other items from the groove dimensions is a result of shrinkage in the electroconductive material caused by burning. A first conductive pattern 3 thus obtained proved to have a very low wiring resistance; the resistance in a longest line portion 0.4 Ω, area resistance of conductive substance 2.1 m Ω.

Figure 8:
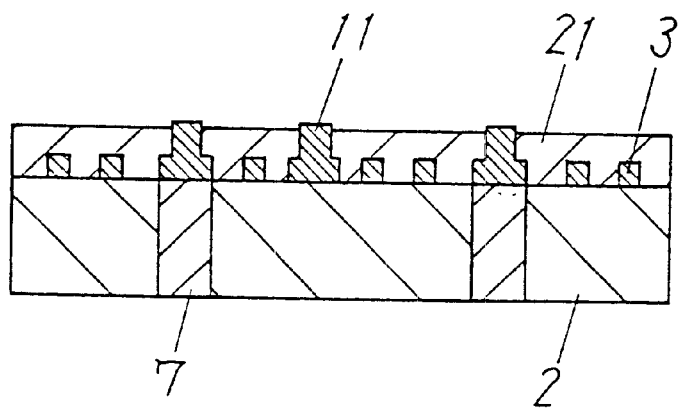
FIG. 8 is a cross sectional view in which a part of the multilayer ceramic substrate after an insulating layer is formed thereon is shown.

A first insulation layer 21 is formed on the ceramic substrate 2 having the first conductive pattern 3 formed thereon, as shown in FIG. 8, by means of screen printing, and burned. What is used for the first insulation layer 21 is a paste of crystalline glass whose thermal expansion coefficient is substantially identical to that of ceramic substrate 2. The top part of via 11 is covered by emulsion of a screen whose pattern is designed so as it is not printed with the crystalline glass paste.

Figure 9:
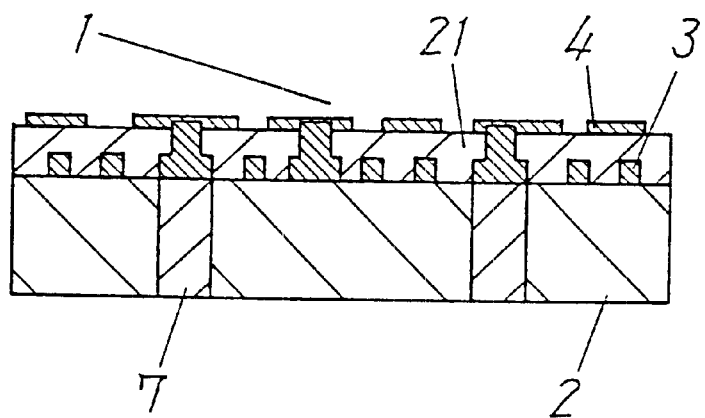
FIG. 9 is a cross sectional view in which a part of the multilayer ceramic substrate after a second conductive pattern is formed thereon is shown.

A second conductive pattern 4 is formed on the first insulation layer 21, as shown in FIG. 9, through a screen printing process; printed under a rule W/S=100 μm/100 μm, and burned. The second conductive pattern 4 and the first conductive pattern 3 are electrically coupled by means of the via 11.

A multilayer ceramic substrate of the present embodiment is fabricated through the steps of manufacturing an intaglio plate 40 out of a flexible resin plate by providing thereon a fine first groove 12 and a fine second groove 13 on the surface, filling the first and the second grooves 12, 13 with an electroconductive paste 42, and deaerating and drying it, repeating the cycle of refilling additional electroconductive paste to replenish a decrement in the volume caused by the drying, and deaerating and drying for a certain predetermined times, stuffing the grooves 12, 13 with a concentrated electroconductive substance and gluing the intaglio plate 40 onto ceramic substrate 2, transferring the electroconductive substance stuffed in the grooves 12, 13 onto the ceramic substrate 2 and burning it to form a fine first conductive pattern 3 thereon, forming a first insulation layer 21 on the first conductive pattern 3 by printing, and forming a second conductive pattern 4 on the first insulation layer 21. Through the above described process steps, such a high density wiring is implementable; in which, for example, the line width is 20 μm, the wiring film thickness is 20 μm, the via diameter is 100 μm, the via height is 60 μm. Thus a multilayer ceramic substrate 1 having a fine pattern, high density and very low wiring resistance has been obtained.

Embodiment 2

A method for fabricating a multilayer ceramic substrate in accordance with a second exemplary embodiment of the present invention is described in the following with reference to FIG. 10(a) through FIG. 10(e).

Figure 10A:
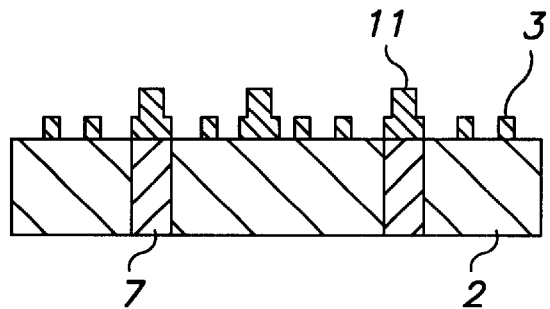
FIG. 10(a), FIG. 10(b), FIG. 10(c), FIG. 10(d) and FIG. 10(e) are cross sectional views in which a part of a multilayer ceramic substrate in accordance with a second embodiment of the present invention is shown to explain the fabricating process steps.

In the first place, a structure as shown in FIG. 10(a) is fabricated through the same procedure used for forming a first conductive pattern 3 in embodiment 1.

Figure 10B:
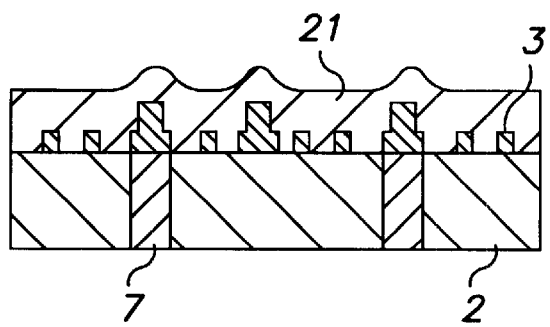
Figure 10C:
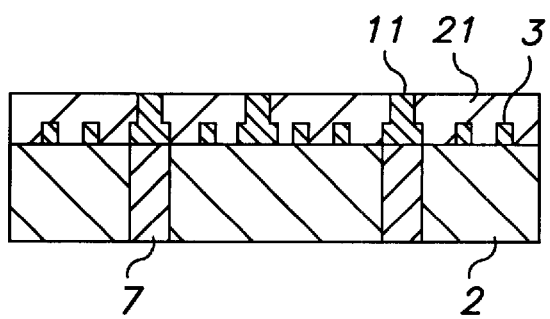

A first insulation layer 21 is formed, as shown in FIG. 10(b), over the first conductive pattern 3 by a screen printing process covering the whole surface including an area above the via 11. After it is dried, the surface of first insulation layer 21 is flattened by surface grinding, as shown in FIG. 10(c), down to a depth where the via 11 is ground off by several micro meters. By the above processing all of the necessary vias are exposed from the first insulation layer 21.

Figure 10D:
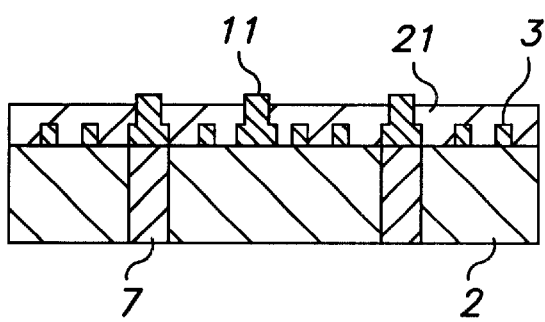

And then, it is burned in a temperature profile with the peak temperature 850° C. After the burning, the via 11 becomes extruded relative to the surface of first insulation layer 21 by approximately 10 μm as a result of shrinkage in the film thickness of first insulation layer 21 caused by burning, as shown in FIG. 10(d).

Figure 10E:
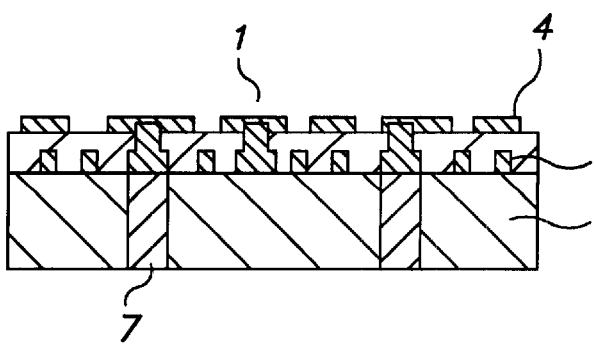

A second conductive pattern 4 is screen-printed with a rule W/S 100 μm/100 μm, as shown in FIG. 10(e), and burned. Thus a multilayer ceramic substrate 1 is fabricated. The second conductive pattern 4 and the first conductive pattern 3 are electrically coupled through the via 11.

The following advantage is presented in the present embodiment. With the size of via and via chip of the first conductive pattern 3 getting smaller, it becomes more difficult, in view of the precision requirements, to form the first insulation layer 21 through screen-printing technology in a pattern so as the printing is performed excluding an area above the via. In accordance with the above method of present embodiment, however, all of the via 11 may be exposed precisely without fail so long as it is formed on the first conductive pattern 3. This means that, through the method of present embodiment, a multilayer ceramic substrate 1 whose wiring density is higher than that of embodiment 1 may be presented.

Embodiment 3

A method for fabricating a multilayer ceramic substrate in accordance with a third exemplary embodiment of the present invention is described in the following with reference to FIG. 11(a) through FIG. 11(d).

Figure 11A:
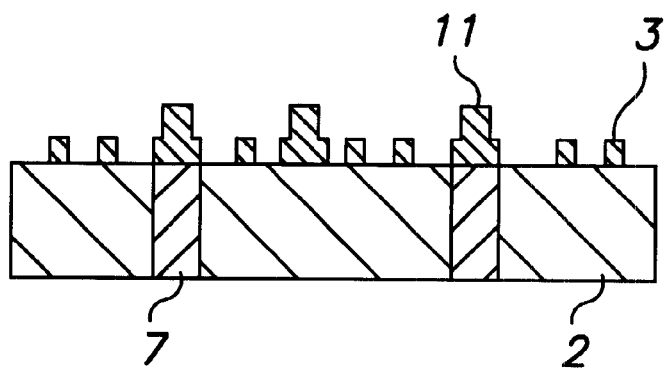
FIG. 11(a), FIG. 11(b), FIG. 11(c) and FIG. 11(d) are cross sectional views in which a part of a multilayer ceramic substrate in accordance with a third embodiment of the present invention is shown to explain the fabricating process steps.

In the first place, a structure as shown in FIG. 11(a) is fabricated through the same procedure used for forming a first conductive pattern 3 of embodiment 1.

Figure 11B:
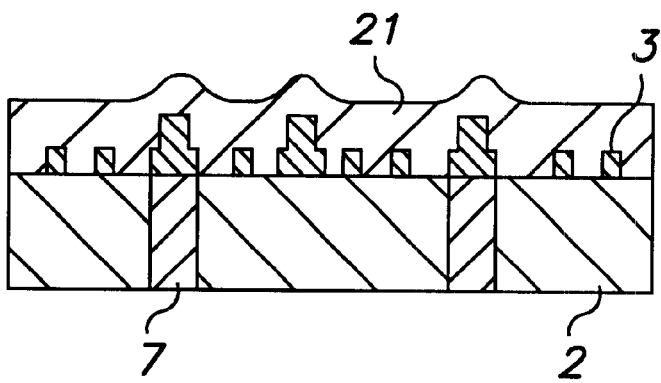

A first insulation layer 21 is formed as shown in FIG. 11(b), over the first conductive pattern 3 by a screen printing process covering the whole surface including an area above the via 11. And then, it is burned in a temperature profile with the peak temperature 850° C. After the burning, the surface of first insulation layer 21 is flattened by surface grinding so as all of the vias 11 are exposed from the first insulation layer 21, as shown in FIG. 11(c).

Figure 11C:
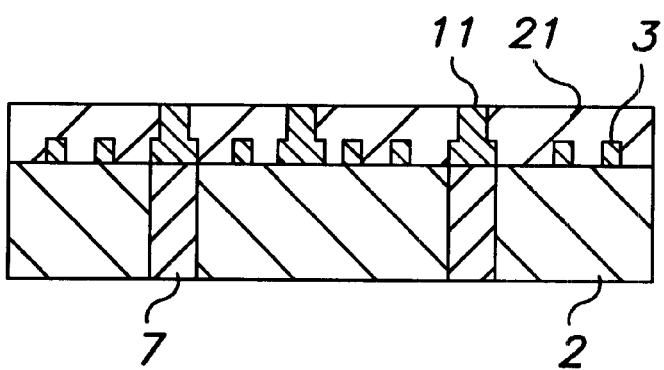
Figure 11D:
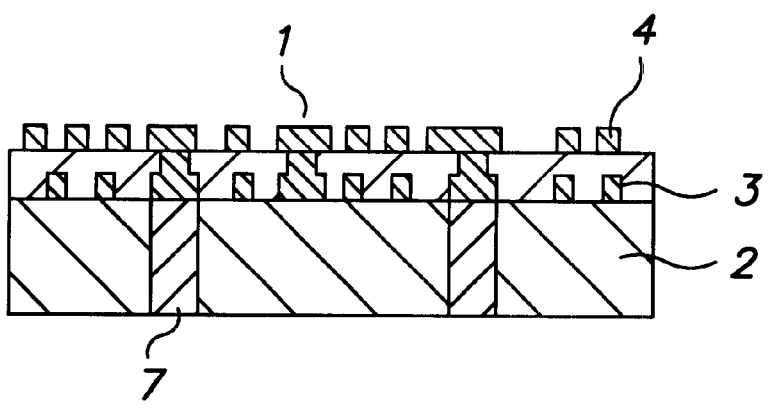

And then, after providing an adhesive layer on the surface of the substrate processed to a state as shown in FIG. 11(c), a second conductive pattern 4 as shown in FIG. 11(d) is transfer-printed in the same procedure used for forming the first conductive pattern 3. The intaglio plate used here is that which is provided with a pattern corresponding to the second conductive pattern 4. The second conductive pattern 4 has been formed under the same wiring rule as used for forming the first conductive pattern 3.

The following advantage is presented in the present embodiment. The via 11 may be exposed precisely without fail so long as it is formed on the first conductive pattern 3. And the height of via 11 and the height of insulation layer 21 are on a same level. Thus the above method is superior to that of embodiment 2 in terms of the flattening capability. Therefore, the above method is quite advantageous when forming a second conductive pattern 4 in a high wiring density through a transfer printing technology using an intaglio plate. This means that a multilayer ceramic substrate 1 having a still higher wiring density than that of embodiments 1 and 2 may be presented through a method of the present embodiment.

Embodiment 4

A method for fabricating a multilayer ceramic substrate in accordance with a fourth exemplary embodiment of the present invention is described in the following with reference to FIG. 12(a) through FIG. 12(f).

FIG. 12(a) through FIG. 12(d) correspond respectively to FIG. 10(a) through FIG. 10(d); the same processes are used upto the step of formation and burning of first insulation layer 21. Therefore, the via 11 has been extruded relative to the surface of first insulation layer 21 by approximately 10 μm.

Figure 12A:
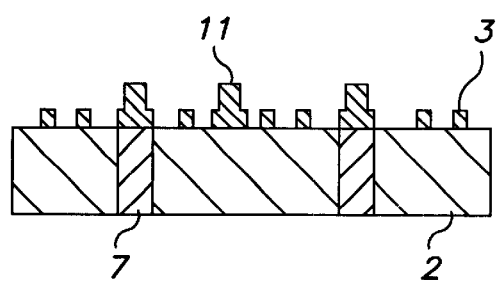
FIG. 12(a), FIG. 12(b), FIG. 12(c), FIG. 12(d), FIG. 12(e) and FIG. 12(f) are cross sectional views in which a part of a multilayer ceramic substrate in accordance with a fourth embodiment of the present invention is shown to explain the fabricating process steps.
Figure 12B:
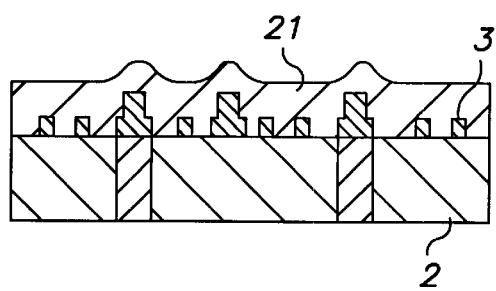
Figure 12C:
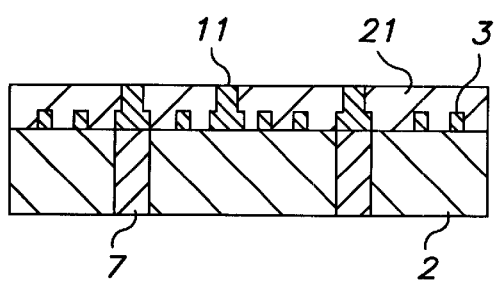
Figure 12D:
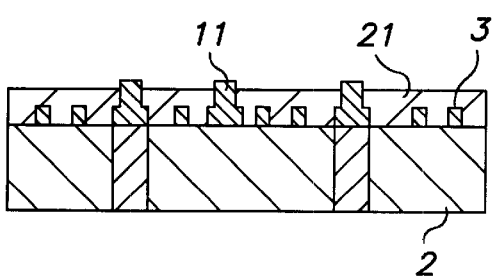
Figure 12E:
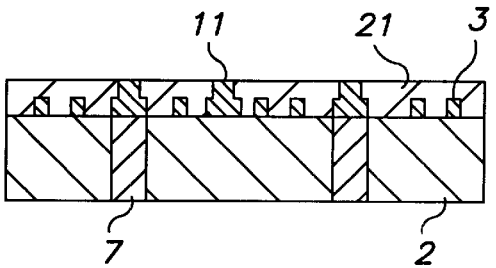
Figure 12F:
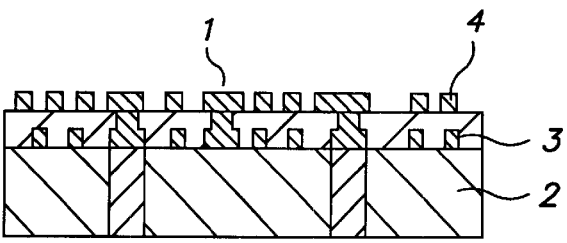

Then, as shown in FIG. 12(e), only the via 11 is ground by a grinding facility to the same level as the surface of first insulation layer 21. A second conductive pattern 4 is formed through the same procedure as used in embodiment 3.

The following advantage is presented in the present embodiment. Although the above method of present embodiment requires the grinding operation for two times, the first grinding is for grinding only the dried skin of insulation layer 21 off, which is quite easy and can be finished within a short time. The second grinding is for grinding only the extruding portion of via 11, which is quite easy and can be finished within a short time, too. The effectiveness of the present method in providing a high density wiring pattern remains the same as in embodiment 3.

Embodiment 5

A method for fabricating a multilayer ceramic substrate in accordance with a fifth exemplary embodiment of the present invention is described in the following with reference to FIG. 13, FIG. 14(a) through FIG. 14(c).

A ceramic substrate 2 is filled with an electroconductive paste in the through hole and burned, and then provided with an adhesive layer 44 on both surfaces. An intaglio plate 40 having a certain specific pattern is filled with an electroconductive paste in the groove in the same way as in embodiment 1, in order to form a first conductive pattern 3 and a third conductive pattern 5, respectively.

Figure 13:
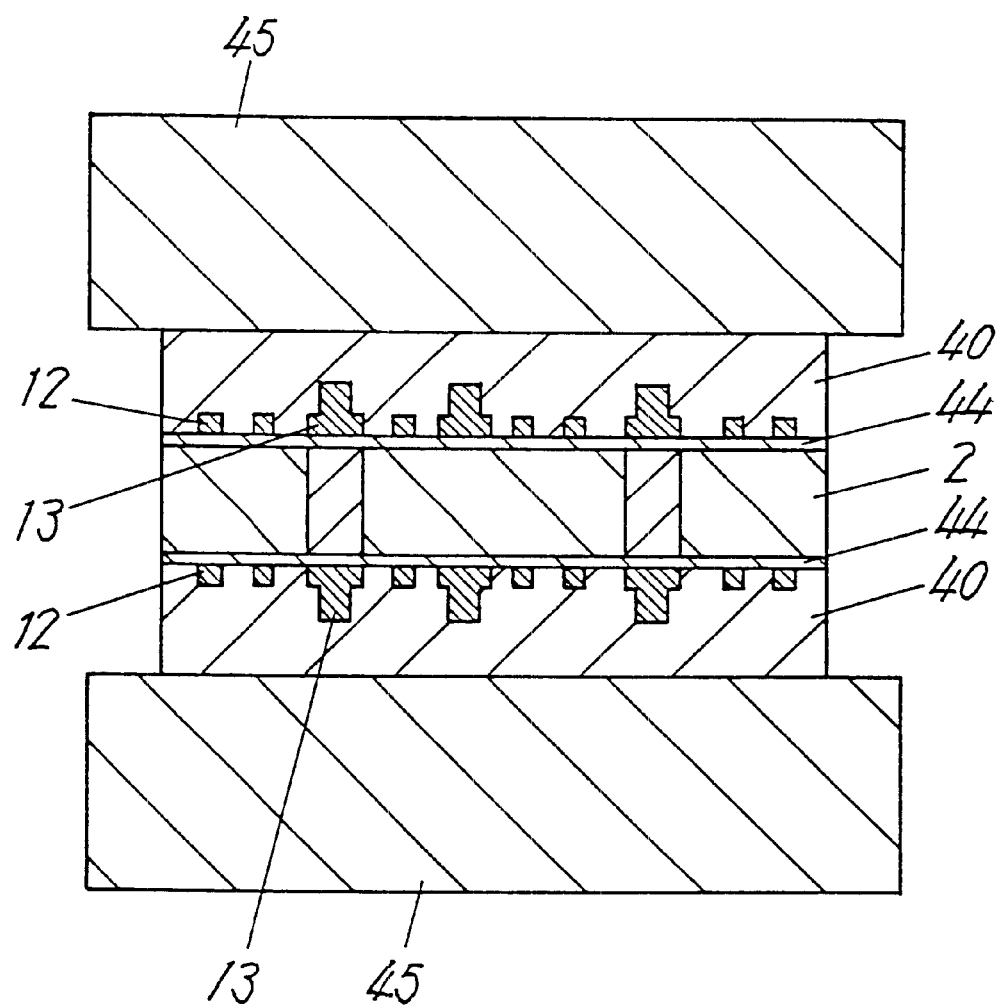
FIG. 13 illustrates how an intaglio plate and a ceramic substrate are attached stacked in making a multilayer ceramic substrate in accordance with a fifth embodiment of the present invention.
Figure 14A:
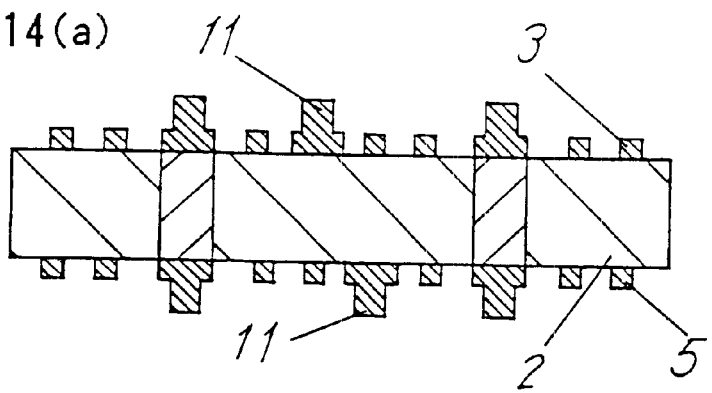
FIG. 14(a), FIG. 14(b) and FIG. 14(c) are cross sectional views in which a part of the multilayer ceramic substrate is shown to explain the abricating process steps.

As shown in FIG. 13, the intaglio plate 40 is attached on both surfaces of substrate 2 simultaneously after being aligned to respective right locations, and then glued together by using a press jig 45. Then, the intaglio plate 40 is separated from the substrate 2 to have the conductive pattern transfer-printed on the substrate 2. Thus a structure as shown in FIG. 14(a) is obtained.

Figure 14B:
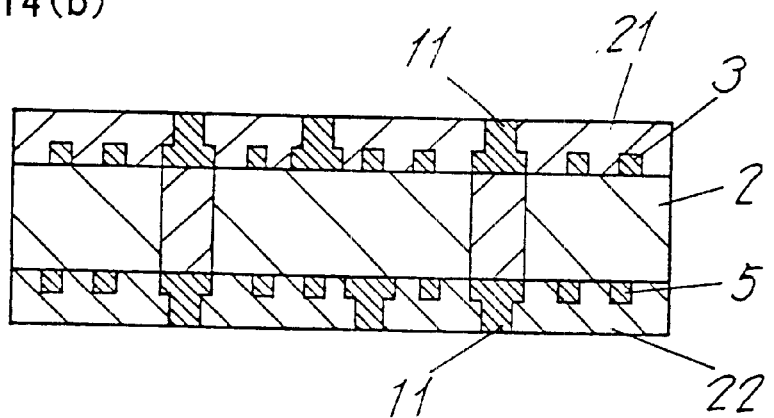

Then, a first and a second insulation layers 21, 22 are provided on both surfaces, as shown in FIG. 14(b), and ground in the same way as in embodiment 4 in order to have the via 11 of first and third conductive patterns 3, 5 exposed.

Figure 14C:
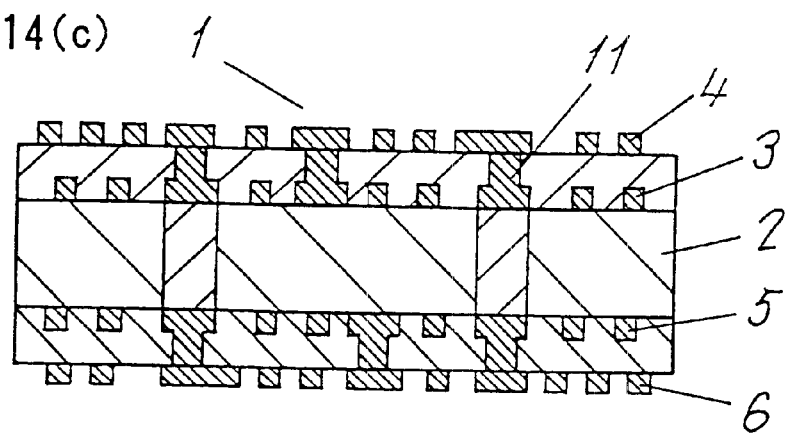

A second and a fourth conductive patterns 4, 6 are also provided respectively, as shown in FIG. 14(c), by filling an intaglio plate 40 having a certain specific pattern with an electroconductive paste in the groove, transfer-printing and burning it in the same way as in the first and third conductive patterns 3, 5.

The following advantage is presented in the present embodiment. As the conductive pattern is formed simultaneously on both surfaces of a ceramic substrate 2, and burning as well as grinding of insulation layers 21, 22 are also performed simultaneously on both surfaces, the manufacturing process steps do not increase as much even if the number of layers is increased. This contributes much to the reduction of manufacturing cost. Furthermore, because of the simultaneous formation on both surfaces a possible warp in a multilayer ceramic substrate may be suppressed low even if there is some difference in the thermal expansion coefficient between insulation layers 21, 22 and ceramic substrate 2. Thus a multilayer ceramic substrate 1 of least warp may be presented in accordance with the present embodiment.

Embodiment 6

A method for fabricating a multilayer ceramic substrate in accordance with a sixth exemplary embodiment of the present invention is described in the following with reference to FIG. 15(a) through FIG. 15(d).

Figure 15A:
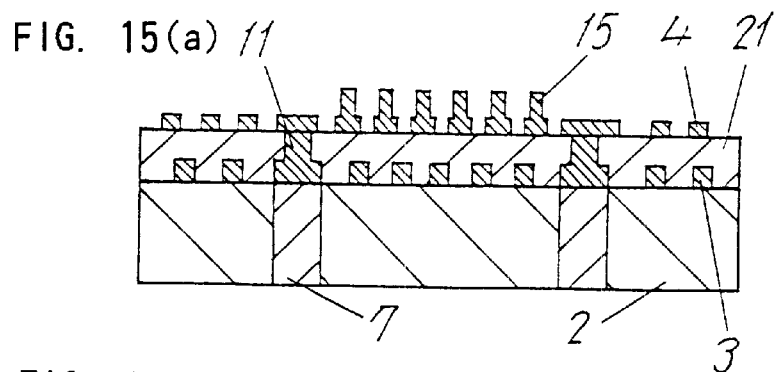
FIG. 15(a), FIG. 15(b), FIG. 15(c) and FIG. 15(d) are cross sectional views in which a part of a multilayer ceramic substrate in accordance with a sixth embodiment of the present invention is shown to explain the fabricating process steps.
Figure 15B:
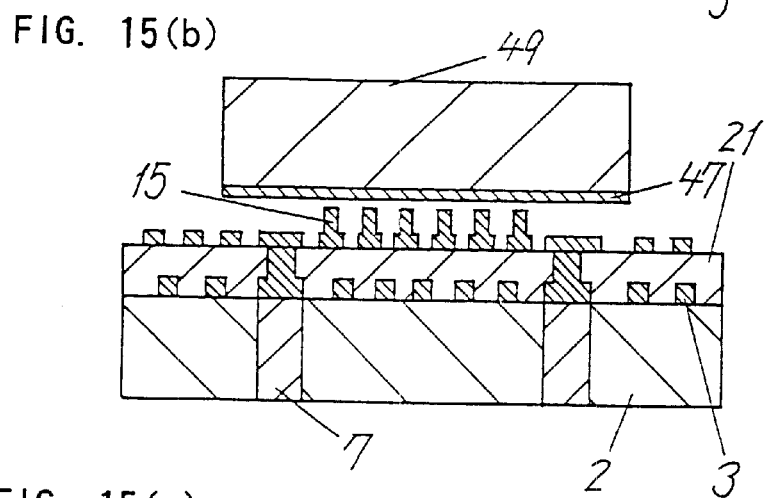

Referring to FIG. 15(a), the process steps used to form the state upto grinding of first insulation layer 21 remain the same as those used in embodiment 4. In the present embodiment, a second groove of an intaglio plate to be used for forming a second conductive pattern 4 has a bump portion at a place corresponding to pad location of an LSI chip. In the same method as used for forming the first conductive pattern 3, the electroconductive material filled in the second groove is transfer-printed and a bump 15, or a protrusion, is formed. The dimensions of bump 15 in the present embodiment are; diameter 50 $\mu$m, height 50 $\mu$m, smallest pitch 100 $\mu$m.

In order to apply an electroconductive adhesive 47 evenly on the top surface of bump 15, a transfer-printing jig 49 is coated in advance with the electroconductive adhesive 47 in an even film thickness, which jig 49 is then lowered in parallel with the ceramic substrate 2 until it makes contact on the bump 15 and the adhesive is transferred thereon.

Figure 15C:
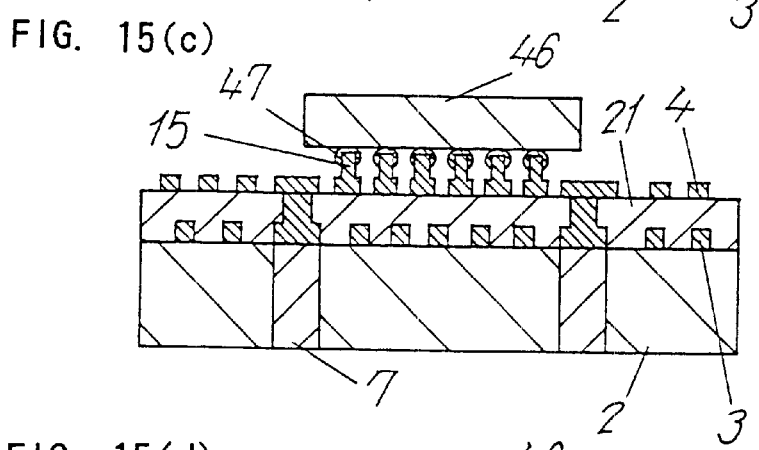

Then, as shown in FIG. 15(c), an LSI chip 46 is mounted on the bump 15 after a pad of the LSI chip 46 and bump 15 are aligned to a right position. As soon as it is mounted on the right position, the electroconductive adhesive 47 is heated and cured to have the LSI chip 46 and the bump 15 connected together.

Figure 15D:
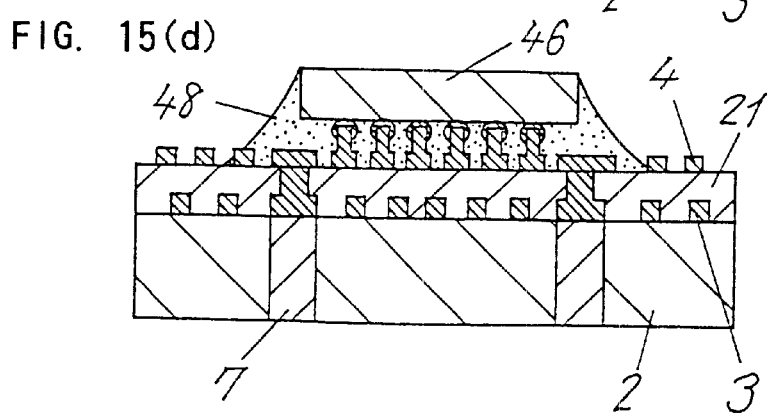

A gap between the LSI chip and the bump 15 is filled with a sealing resin 48, as shown in FIG. 15(d), which is then cured by heating.

The following advantage is presented in the present embodiment. As the bump 15 is formed simultaneously on the second conductive pattern 4, there is no need of forming a bump in the LSI chip 46. This leads to a reduction in manufacturing cost of the LSI chip 46. Even when a plurality of LSI chips 46 are mounted, the bump 15 may be formed simultaneously on the second conductive pattern 4 for required numbers needed for the mounting without having additional process steps. Thus, the bump 15 may be formed for the numbers required to encounter a certain number of pieces of LSI chip 46 without having additional process step. Furthermore, regarding a test after mounting of LSI chip 46, whether the LSI chip has been mounted right or not may be tested electrically before curing the electroconductive adhesive 47. If a chip is not mounted well, the chip may be demounted for remounting, or a replacement chip may be mounted thereon. The electroconductive adhesive 47 may be cured only after it is confirmed to be acceptable after the rework. Therefore, the final yield rate of multilayer ceramic substrates may be improved. In some cases, an LSI chip 46 which is already provided with a bump has to be mounted. Even in such a case, the LSI chip 46 may be mounted direct on, for example, a multilayer ceramic substrate of embodiment 5 using a most suitable method. In this way, it is effective as a high-density multilayer ceramic substrate.

Figure 16:
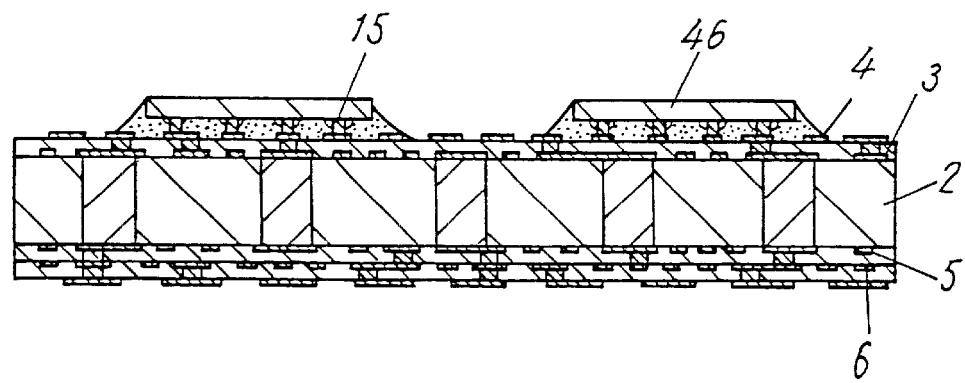
FIG. 16 is a cross sectional view in which a part of the multilayer ceramic substrate in accordance with another embodiment is shown.

A high-density multilayer ceramic substrate of the present embodiment may be evolved to still other embodiments. For example, FIG. 16 shows the one in which the wiring has been provided in high density by forming first to fourth conductive patterns 3, 4, 5, 6 through transferprinting of patterns using intaglio plates, and an LSI chip 46 is mounted direct on the surface with the face down.

Figure 17:
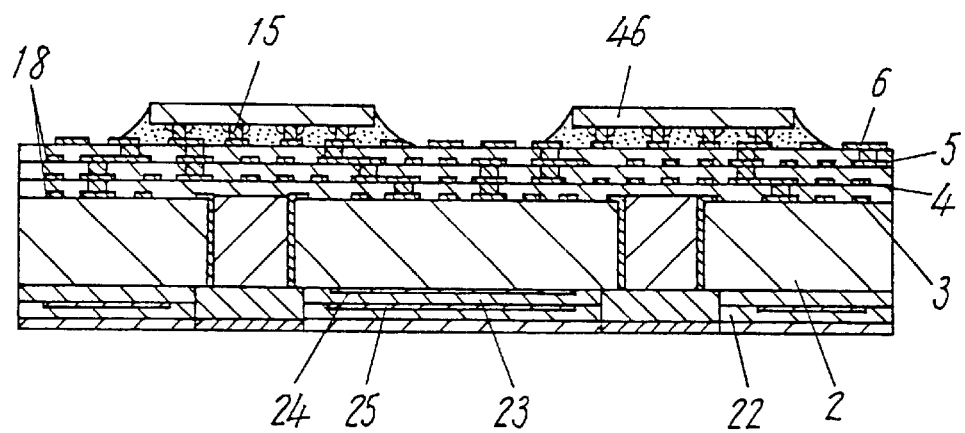
FIG. 17 is a cross sectional view in which a part of the multilayer ceramic substrate in accordance with yet another embodiment is shown.

In the one shown in FIG. 17, the first to fourth conductive patterns 3, 4, 5, 6 are disposed on one of the surfaces of ceramic substrate 2, while on the other surface a dielectric layer 23 sandwitched by a power source electrode 24 and a ground electrode 25, each formed by a screen printing process or other such process, is provided. A dielectric substance of high dielectric constant ∈=10000 is used for the dielectric layer 23; which proved to be quite effective in reducing the power source noise. In an embodiment as shown in FIG. 17, a shield electrode 18 is provided at the outermost part of each of the first to third conductive patterns 3, 4, 5, and the power source electrode 24 and the ground electrode 25 contained as part of the first to third conductive patterns 3, 4, 5 have been provided in the form of a meshed pattern. These contributed to raise the anti-noise characteristic of signal lines and to lower the impedance of power source electrode 24 and ground electrode 25.

Figure 18A:
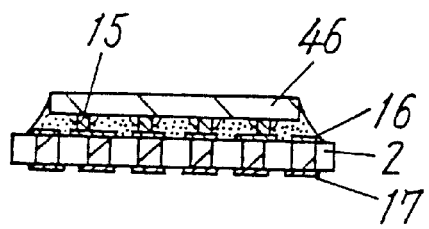
FIG. 18(a) is a cross sectional view in which a part of a chip-size package fabricated through the same method used for fabricating the multilayer ceramic substrate is shown.
Figure 18B:
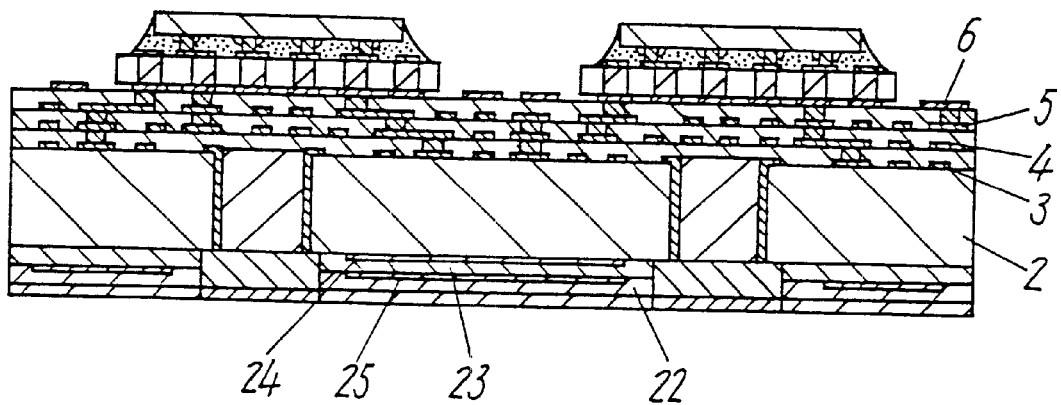
FIG. 18(b) is a cross sectional view in which a part of the multilayer ceramic substrate mounted with the chip-size package is shown.
Figure 19A:
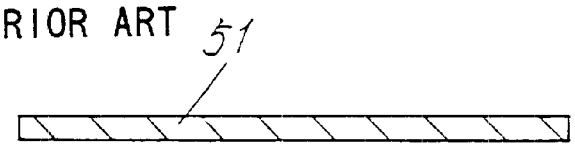
FIG. 19(a), FIG. 19(b), FIG. 19(c), FIG. 19(d), FIG. 19(e), FIG. 19(f) and FIG. 19(g) are cross sectional views in which a part of a prior art multilayer ceramic substrate is shown to illustrate how it has been fabricated.
Figure 19B:
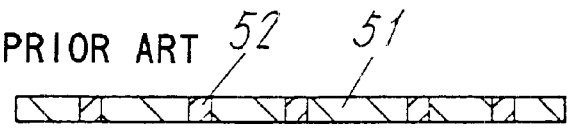
Figure 19C:
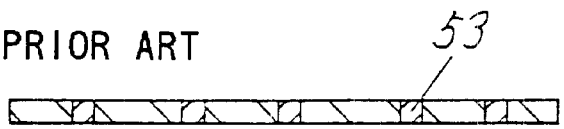
Figure 19D:
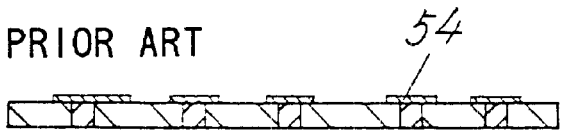
Figure 19E:
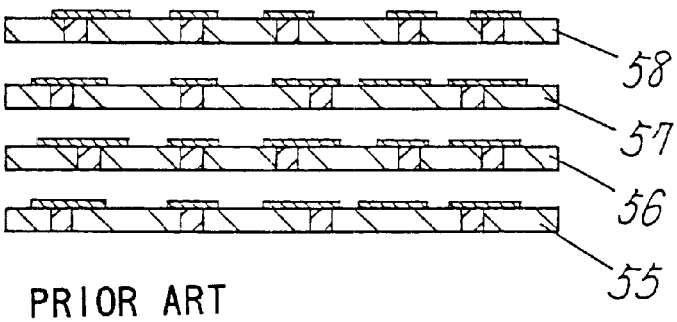
Figure 19F:
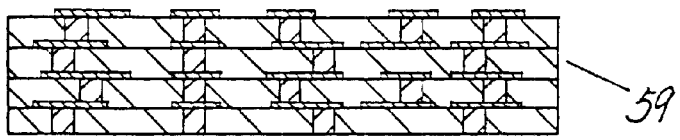
Figure 19G:

Still other exemplary embodiments are shown in FIG. 18(a) and FIG. 18(b). What is shown in FIG. 18(a) is a chip-size package (CSP) fabricated in accordance with a method of the present embodiment; in which, a bump 15 has been formed simultaneously with a fifth conductive pattern 16. What is shown in FIG. 18(b) is the one which has been fabricated by mounting said CSP direct on the surface of a multilayer ceramic substrate having a dielectric layer 23. The CSP comprises a land section 17 of 0.8 mm pitch full grid with total number of lands reaching 400, which means that it requires a high density wiring in the multilayer ceramic substrate. A conventional multilayer ceramic substrate is unable to meet the above requirements. Thus a design rule of the present embodiment W/S=20 $\mu$m/40 $\mu$m has proved to be quite effective.

The present invention can be embodied in various forms, without departing from the spirit or the main feature. The aforedescribed embodiments are only examples and not to be understood limitedly. For example, although in the above embodiments a polyimide film has been exemplified as the material for the intaglio plate, polyethylene terephthalate (PET) or polyether-imide (PEI) may of course be used for the purpose. The scope of the present invention is shown by the claims, and not to be restricted by the above explanation. Modifications or changes in the scope of the claims or equivalents thereto are all within the scope of the invention.

What is claimed is:

1. A method for fabricating a multilayer ceramic substrate comprising the steps of:
    (a) manufacturing an intaglio plate of flexible resin substance, on which a first groove corresponding to a first conductive pattern is formed and a second groove having a depth deeper than that of the first groove is formed at a place corresponding to a via of the first conductive pattern;
    (b) filling the first and the second grooves with an electroconductive paste;
    (c) increasing conductivity of respective paths in said first and second grooves by deaeration and drying said paste;
    (d) adding additional electroconductive paste to said first and second grooves to replenish a decremented volume of said paste;
    (e) gluing said intaglio plate onto a ceramic substrate by applying heat and pressure;
    (f) separating said intaglio plate from said ceramic substrate to have a pattern of the electroconductive paste transferred onto the ceramic substrate, and burning it so as to form said first conductive pattern on the ceramic substrate;
    (g) forming an insulation layer on said first conductive pattern; and
    (h) forming a second conductive pattern on said insulation layer.

2. The method for fabricating a multilayer ceramic substrate recited in claim 1, wherein said ceramic substrate is provided with a resin layer not thicker than 20 $\mu$m on at least one surface, said resin being one of a thermosetting resin and a thermoplastic resin.

3. The method for fabricating a multilayer ceramic substrate recited in claim 1, wherein said insulation layer is formed by a printing technology covering the whole area of said first conductive pattern, and said via is exposed through abrasion or grinding of the dried skin of said insulation layer before burning said insulation layer.

4. The method for fabricating a multilayer ceramic substrate recited in claim 1, wherein said insulation layer is formed by a printing technology covering the whole area of said first conductive pattern, and said via is exposed through abrasion or grinding of said insulation layer after burning said insulation layer.

5. The method for fabricating a multilayer ceramic substrate recited in claim 1, wherein said insulation layer is formed by a printing technology covering the whole area of said first conductive pattern, and said via is exposed through abrasion or grinding of the dried skin of said insulation layer, and then the abrasion or grinding is applied again after burning.

6. The method for fabricating a multilayer ceramic substrate recited in claim 1, wherein said second conductive pattern is formed through the same process steps used for forming said first conductive pattern.

7. The method for fabricating a multilayer ceramic substrate recited in claim 6, further comprising the step of forming a third conductive pattern and a fourth conductive pattern by the same process step used for forming said first and second conductive patterns on a surface of said ceramic substrate opposite to the surface on which said first and second conductive patterns are formed.

8. The method for fabricating a multilayer ceramic substrate recited in claim 6, further comprising the step of mounting an LSI chip with the face down on a part of one of said first and second conductive patterns to be electrically connected.

9. The method for fabricating a multilayer ceramic substrate recited in claim 6, further comprising the step of mounting an LSI chip with the face down on a part of one of said first and second conductive patterns to be electrically connected, after forming a fine bump on one of said first conductive pattern and said second conductive pattern by disposing said second groove at a place corresponding to a pad of said LSI chip and applying an electroconductive paste on the top of said bump.

10. The method for fabricating a multilayer ceramic substrate recited in claim 1, further comprising the step of forming a third conductive pattern and a fourth conductive pattern by the same process step used for forming said first and second conductive patterns on a surface of said ceramic substrate opposite to the surface on which said first and second conductive patterns are formed.

11. The method for fabricating a multilayer ceramic substrate recited in claim 10, in which said first to fourth conductive patterns are formed through a transfer printing technology, wherein the gluing operation for said third conductive pattern and that for said first conductive pattern, and the gluing operation for said fourth conductive pattern and that for said second conductive pattern, respectively, are performed simultaneously.

12. The method for fabricating a multilayer ceramic substrate recited in claim 1, further comprising the step of forming a dielectric layer on a part of said ceramic substrate.

13. The method for fabricating a multilayer ceramic substrate recited in claim 1, wherein a through hole is provided in said ceramic substrate, and said through hole is filled with an electroconductive substance, and then the electroconductive substance is burned.

14. The method for fabricating a multilayer ceramic substrate recited in claim 1, further comprising the step of mounting an LSI chip with the face down on a part of one of said first and second conductive patterns to be electrically connected.

15. The method for fabricating a multilayer ceramic substrate recited in claim 1, further comprising the step of mounting an LSI chip with the face down on a part of one of said first and second conductive patterns to be electrically connected, after forming a fine bump on one of said first conductive pattern and said second conductive pattern by disposing said second groove at a place corresponding to a pad of said LSI chip and applying an electroconductive paste on the top of said bump.

* * * * *

UNITED STATES PATENT AND TRADEMARK OFFICE
CERTIFICATE OF CORRECTION

PATENT NO.   : 6,429,114 B1
DATED        : August 6, 2002
INVENTOR(S)  : Masaaki Hayama et al.

It is certified that error appears in the above-identified patent and that said Letters Patent is hereby corrected as shown below:

Column 11,
Line 44, delete the word "deaeration" and substitute therefor -- deaerating --

Column 12,
Lines 23, 30 and 35, "6" should read -- 1 --.
Lines 44 and 67, "1" should read -- 6 --.
Line 51, "10" should read -- 7 --.

Column 13,
Line 5, "1" should read -- 6 --.

Signed and Sealed this

Twenty-third Day of September, 2003

JAMES E. ROGAN
*Director of the United States Patent and Trademark Office*